(12) United States Patent
Reichert et al.

(10) Patent No.: US 6,286,120 B1
(45) Date of Patent: Sep. 4, 2001

(54) MEMORY ARCHITECTURE FOR AUTOMATIC TEST EQUIPMENT USING VECTOR MODULE TABLE

(75) Inventors: Peter A. Reichert, Thousand Oaks; Benjamin J. Brown, Westlake Village, both of CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 08/299,753

(22) Filed: Sep. 1, 1994

(51) Int. Cl.[7] ................................................. G06F 11/00
(52) U.S. Cl. ................................................. 714/738
(58) Field of Search ........................... 371/27, 24, 25.1, 371/26; 395/432, 433; 714/737, 736, 738

(56) References Cited

U.S. PATENT DOCUMENTS

| | | | |
|---|---|---|---|
| 4,313,200 | * 1/1982 | Nishiura | 371/25.1 |
| 4,451,918 | 5/1984 | Gillette | 371/27 |
| 4,875,210 | 10/1989 | Russo et al. | 371/27 |
| 4,994,732 | 2/1991 | Jeffrey et al. | 324/73.1 |
| 5,122,988 | 6/1992 | Graeve | 365/219 |
| 5,151,903 | 9/1992 | Mydill et al. | 371/27 |
| 5,179,667 | * 1/1993 | Iyer . | |
| 5,270,582 | 12/1993 | Brown et al. | 307/269 |
| 5,337,045 | 8/1994 | Shirasaka | 340/825 |
| 5,345,574 | * 9/1994 | Sakurada et al. . | |
| 5,379,400 | * 1/1995 | Barakat et al. . | |

FOREIGN PATENT DOCUMENTS

| | | |
|---|---|---|
| 429673 | 6/1990 | (EP) . |
| 54-76041 | 6/1979 | (JP) . |

\* cited by examiner

Primary Examiner—James P. Trammell
Assistant Examiner—Pierre E. Elisca
(74) Attorney, Agent, or Firm—Edmund J. Walsh

(57) ABSTRACT

A tester having a fast but flexible pattern generator which is implemented using readily available memories. The tester includes a pattern memory which holds test vectors. The vectors are organized into modules. The order of execution of the modules is selected from a list stored in memory. In the preferred embodiment, memories which operate in burst mode are used to implement the pattern memory. To compensate for the decrease in data rate which occurs when execution switches between modules in the middle of a burst, the memory refresh rate is dynamically altered upon switching between modules.

21 Claims, 5 Drawing Sheets

MEMORY ARCHITECTURE FOR AUTOMATIC TEST EQUIPMENT USING VECTOR MODULE TABLE

This invention relates generally to automatic test equipment d more particularly to memory architecture for the pattern generating portion of automatic test equipment.

Automatic test equipment (called simply a "tester") is used to test electronic components and devices as they are being manufactured. The tester has numerous signal lines (called "channels") which connect to the device under test ("DUT"). Stimulus signals are placed on some of these lines and the response of the DUT is measured on other lines. By comparing the response received from the DUT to an expected response, faults in the DUT may be detected.

State of the art test systems are controlled by very fast computers which run programs called "patterns." The pattern contains information about the stimulus signals that should be applied, the order in which those signals should be applied and the expected response from the DUT. This information for any cycle of the tester is called a "vector." The pattern is, thus, made up of a series of vectors. A typical pattern for a tester designed to test VLSI components can have over one million vectors.

Testers must run at state of the art speeds for several reasons. First, it is desirable that each test be completed as quickly as possible since manufacturers want to produce as many parts as quickly as possible. Secondly, certain types of faults in components are not detectable unless the device is operated at its intended operating speed. To enable the tester to run at state of the art speeds, the patterns are stored in very fast RAM memories.

Testers use vast amounts of RAM. A typical tester needs to store around four million vectors. Each vector contains several bits of data for each channel in the tester. Up to 512 channels is a typical number of channels in a tester. In addition, each vector contains several bits of control information. The net result is that a tester typically contains in the range of 750 Mbytes of RAM. Using only the most advanced RAM for all this memory would result in a tester which would be too expensive.

Rather, there is a speed/cost/flexibility tradeoff associated with selecting RAM. Flexibility refers to the range of memory addresses which can be accessed in consecutive memory cycles. Maximum flexibility occurs when any address can be accessed on any cycle. Minimum flexibility occurs when only addresses in sequence may be accessed on consecutive cycles. Higher speed memories for a given flexibility level cost more. Likewise, higher performance memories operating at a given speed cost more.

Typically, flexibility has been sacrificed to get good speed at reasonable cost. In the tester, vectors are executed in exactly the order they have been written into the pattern memory. Users of testers would prefer not to have such a limitation. It is sometimes difficult to develop a full pattern in exactly the order it is to be executed. Test engineers usually prefer to approach the problem of writing a test pattern by segmenting the DUT into various functional elements and writing a pattern to test each functional element. Requiring sequential execution of vectors in memory also implies that control constructs such as looping and branching may not be used in the pattern. A further disadvantage of sequential execution occurs because some steps needed to test different functional elements or to perform different tests on one functional element will often be the same. For example, it will often be necessary to perform an initialization sequence repeatedly on the DUT as it is fully tested. If a pattern may only be executed in the order it is written into memory, the initialization sequence must be written into the memory every time it is used. Making multiple copies of the same set of vectors wastes space in the memory and also makes it difficult for the test engineer to change the test pattern because every copy must be changed.

Some flexibility may be obtained because the tester is usually connected to and controlled by a computer work station. The work station contains bulk storage media, such as a disk or magnetic tape, that can inexpensively store large amounts of data. Different patterns can be developed and stored on the work station and then loaded into the tester when needed to perform a test.

To facilitate making different patterns, vectors are usually grouped into modules. Each module is a collection of vectors which performs one or more functions. For example, one module might contain vectors to initialize the DUT. Another module might contain vectors to test registers inside the DUT and yet another module might contain vectors to test arithmetic logic circuitry inside the DUT. To make a pattern, these modules could be linked together on the work station and then loaded into the pattern memory of the tester.

The use of modules has the further advantage of allowing a complicated pattern to be broken into pieces which can be more easily developed and debugged. However, it does not fully solve the problem. The process of loading a new pattern from the work station can take many minutes. Since the tester is used in a manufacturing operation to test many parts as rapidly as possible, a delay of a few minutes for each part tested would add an unacceptable delay. Use of a work station also does not eliminate memory waste caused by repeating sequences of vectors in the code. It also does not allow branching, looping or similar nonsequential control constructs.

Limited nonsequential control constructs have been incorporated into testers by allowing only those control constructs in which the address for the next vector to be executed is limited to one of a very small number of possibilities. One such approach has been to allow a given vector from the pattern memory to be executed a specified number of times before the next vector in sequence is executed. This approach provides a useful feature in that it reduces the number of vectors that have to be stored in a pattern memory for some types of patterns. It also does not unduly complicate the tester circuitry because the memory address for the next vector to be executed could have only one of two values: the same as the current address or one address higher. This approach does not allow the tester to execute groups of vectors repeatedly or in any order different from the order in which they have been placed in the pattern memory.

Another approach to providing greater flexibility while still limiting the number of choices for the next address is to provide multiple memories. One of the memories can be programmed to contain groups of vectors that are repeated in the test pattern, much like a subroutine in traditional computer programming. During execution of the pattern, the vectors in the first memory are executed in sequence until a vector is reached which indicates that the "subroutine" vectors should be executed from a different memory. Execution of vectors switches over to the second memory until a vector is reached which indicates execution of vectors should resume from the first memory. Thereafter, the vectors in the first memory are executed sequentially. There is no limit on the number of times that the vectors in the subroutine memory can be executed, thereby reducing the need to repeat those vectors at multiple places in the pattern.

Variations on this approach are possible. U.S. Pat. No. 4,502,127 to Garcia describes a variation where vectors may be developed by taking data from both the large memory and the subroutine memory simultaneously. Japanese patent publication 52-144125 describes a variation where the "subroutine" is implemented in a different region of the same memory as the main pattern. All of these approaches reduce the amount of memory needed to store a pattern.

The need to provide more flexibility in the order of execution of vectors can also be addressed by using multiple memories. In some commercial systems, one memory is very large and inflexible. A second memory is much more flexible and allows branching and looping, but is very small.

Various implementations of this basic approach are possible. U.S. Pat. No. 4,451,918 to Gillette describes a tester having two banks of memory. One bank is a dynamic RAM which stores a large number of vectors. The other is static RAM which stores a smaller number of vectors. Vectors are executed out of the smaller static RAM. To run a large pattern, vectors are loaded into the static RAM in blocks. To avoid delays caused by reloading the static RAM, the static RAM bank contains two memories and one is being reloaded while vectors are being executed from the other. However, this approach is limited in that when vectors need to be executed in a nonsequential order, the next vector to be executed must be contained in the static RAM which is currently being used to execute vectors.

U.S. Pat. No. 4,875,210 to Russo et al. describes a tester system which also contains a large dynamic RAM which must execute vectors in sequential order and a smaller static RAM which contains vectors which are not executed in sequential order. In that patent, the test pattern is divided into sequential and nonsequential blocks of vectors before being loaded into the tester.

Using different types of memories allows a tradeoff between flexibility and cost. The flexible memories are very costly and must be used sparingly. As a result, the size of the flexible memories is usually limited. A typical tester will have a flexible memory which stores only one thousand vectors. This limited amount of memory is often not adequate.

Though many of these techniques have been used simultaneously in commercial testers, there is still a need for a tester which can be flexibly programmed and yet be implemented with relatively low cost, commercially available memories.

SUMMARY OF THE INVENTION

With the foregoing background in mind, it is an object of the invention to provide a tester which runs at high speeds while allowing large modules of vectors to be executed multiple times during a pattern without repeating those vectors within the pattern.

It is also an object to provide a tester which runs at high speeds and allows large modules of vectors to be repeatedly executed in a loop.

It is a further object to provide a tester which can be quickly reprogrammed to change the order of execution of large modules of vectors.

It is yet another object to achieve the foregoing objects at an affordable cost.

The foregoing and other objects are achieved in a tester with a large memory segmented into a plurality of modules. The tester includes further memory locations storing the location of each module in the large memory and further memory locations indicating the order in which the memory modules in the large memory should be executed. Execution of a pattern is accomplished by reading the order in which the modules should be executed from memory and then using the information stored in memory about the location of each module to determine the address in the large memory of the next vectors to execute.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
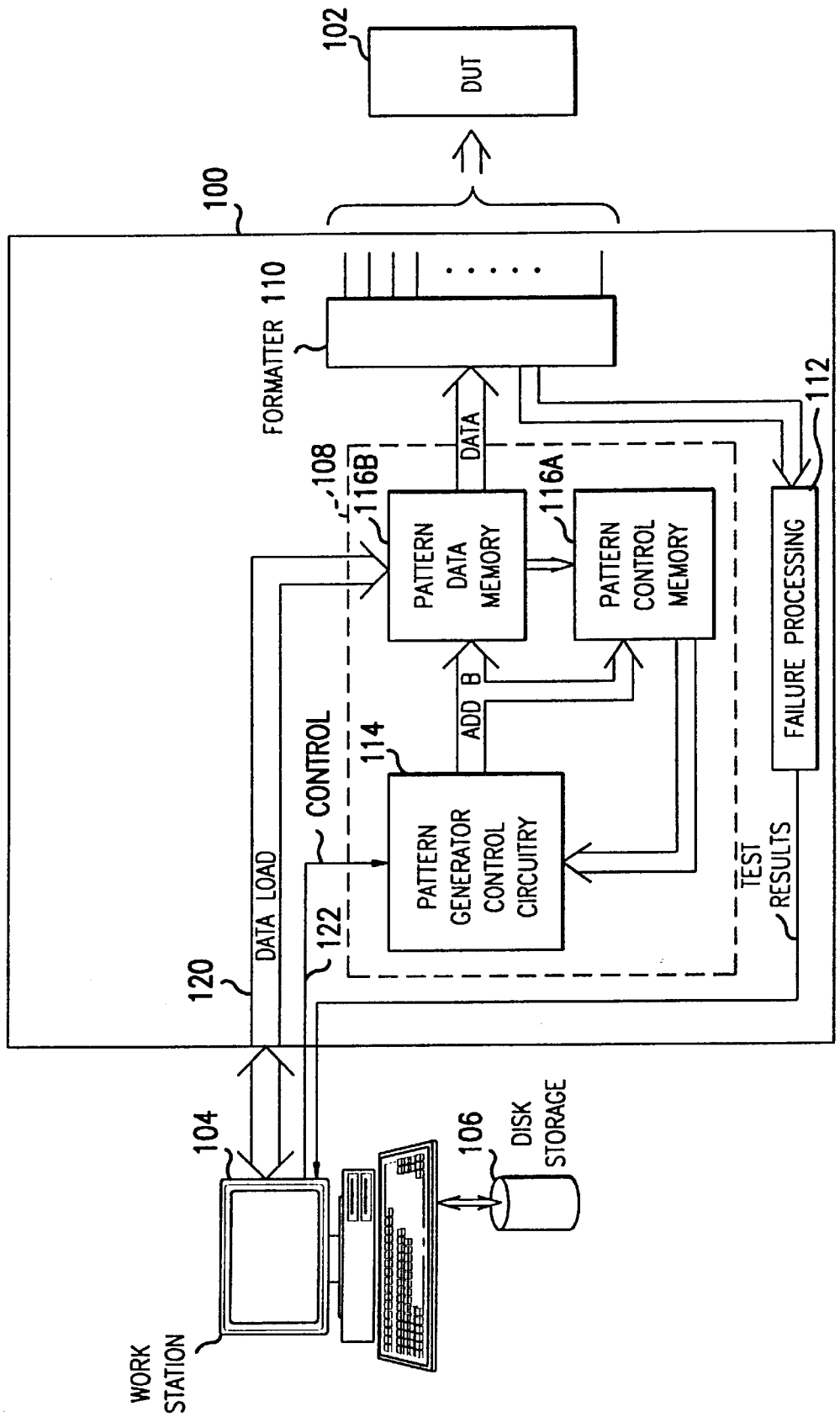
FIG. 1 is a block diagram of a tester system according to the invention.

FIG. 1 shows a tester 100 according to the invention. In operation, tester 100 is connected to some device under test (DUT) 102. The preferred embodiment as described herein is particularly useful for testing VLSI chips. However, DUT 102 might also be a printed circuit board or other electronic component.

Tester 100 is controlled by work station 104. Work station 104 contains a computer, a user interface, such as a keyboard and video display terminal, and bulk storage such as disk 106. In use, patterns are developed on work station 104 and then loaded into tester 100 to test DUT 102.

Tester 100 includes a pattern generator 108. Pattern generator 108 includes pattern memory 116 which is divided into two pieces, pattern data memory 116B and pattern control memory 116A. Each vector stored in pattern memory 116 includes data bits and control bits. For ease of implementation, this information may be stored in one or several memories. The size of pattern memory 116 is not critical. However, it is preferably in the range of 16M to 64M vectors.

The data bits are provided to formatter 110. Formatter 110 is a conventional circuit which accepts the data stored in pattern data memory 116B and applies the appropriate electrical signals to DUT 102. Formatter 110 also accepts electrical signals from DUT 102 and compares them to data values stored in pattern data memory 116B. The results of these comparisons are provided to failure processor 112.

Failure processor 112 is made up of circuitry conventionally found in a tester. It recognizes errors when the expected signals from DUT 102 do not match the measured signals and stores information about the failure. The failure information is then passed back to the work station 104.

The information in pattern control memory 116A is provided to pattern generator control circuitry 114. The information in pattern control memory 116A indicates which vector stored in pattern memory 116 should be executed next. Pattern control circuitry 114 uses the information to compute the next address for pattern memory 116. For example, in a tester which can be programmed to repeat a vector a specified number of times, pattern control memory 116A will store information indicating that the vector is to be repeated and how many times. Pattern generator control circuitry will repeat the current address the specified number of times before incrementing to the next address.

Pattern generator 108 may be controlled from work station 104. Work station 104 provides information for pattern memory 116 over system bus 120. Control information may also be supplied over control lines 122. It will be appreciated, though, that busses in computer systems may be used to carry control information as well as data such that control signals might be carried on system bus 120. Due to the long time it takes to load pattern memory 116, it is intended to be loaded over system bus 120 once before tests are run on DUT 102. Generally, numerous similar devices will be tested before the contents of pattern memory 116 are changed.

Work station 104 also provides control information to pattern generator control circuitry 114 over control lines 122. As in a conventional tester, this information initiates a pattern. Once a pattern is initiated, execution of the pattern is under the control of pattern generator control circuitry 114 rather than work station 104. As will be described in greater detail below, the information could include such information as where in memory to start or stop executing the pattern or which one of a plurality of patterns to execute.

FIG. 1 does not show such details of a tester as power supplies and timing generation. However, such details are well known in the art and not shown explicitly.

Figure 2:
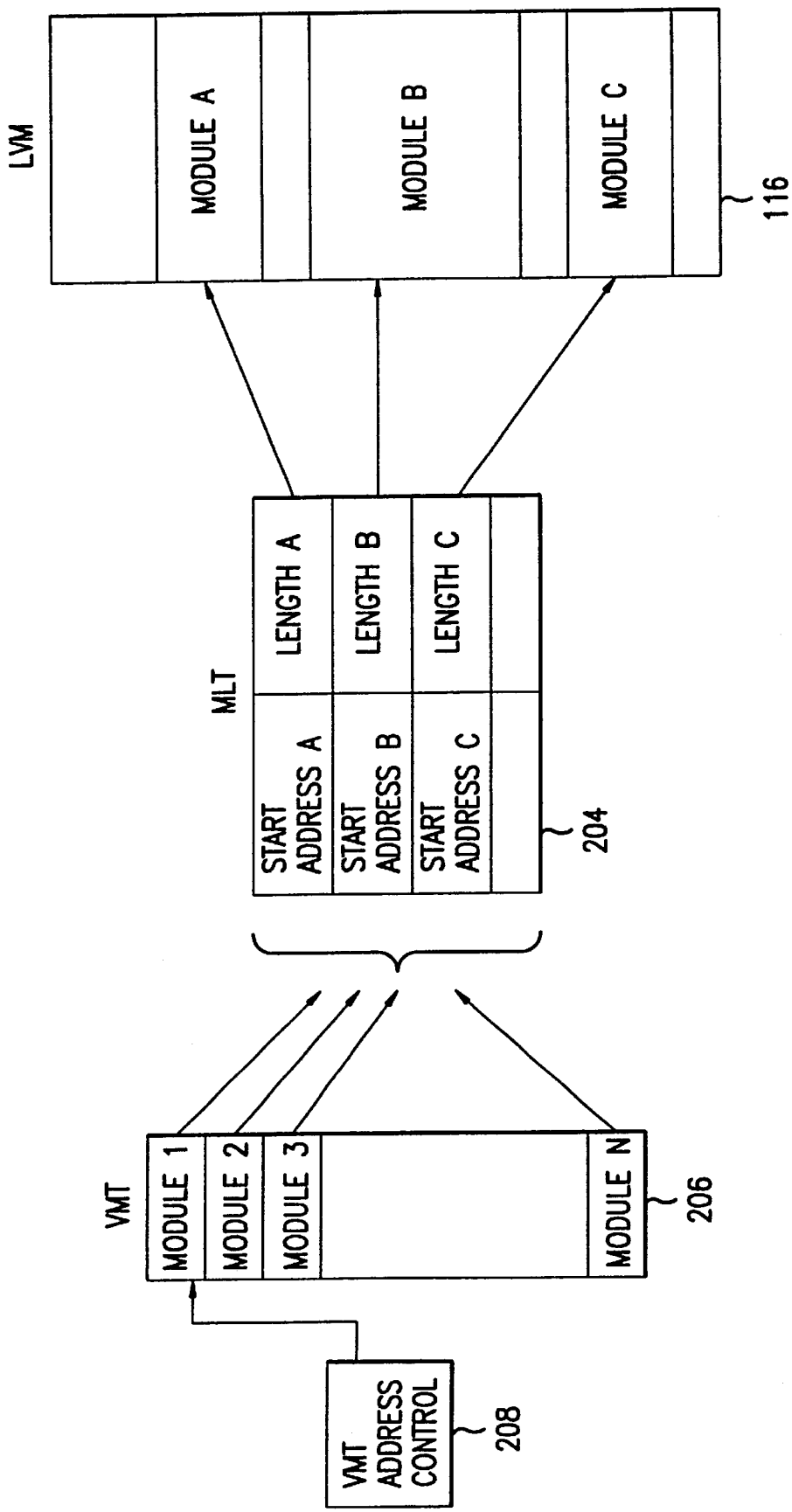
FIG. 2 is a conceptual sketch of the memory architecture of the invention.

Turning now to FIG. 2, the memory architecture of tester 100 is shown. This figure shows the type of information which is stored in memory. The information may be stored in the same or different memory devices. Allocation of the specific information shown to specific memory devices is a design choice which is not critical to the invention.

FIG. 2 shows pattern memory 116, also called the Large Vector Memory, or LVM. Pattern memory 116 stores a plurality of modules of vectors. Here, only three modules are shown for clarity. However, it should be appreciated that an actual pattern would contain numerous modules.

The size of each module is not critical to the invention. Each module is typically in excess of 500 vectors long and more likely in excess of 1000 vectors. For convenience in implementing control circuitry, it may be desirable to impose a lower limit on the size of each module. In the preferred embodiment, each module must have a length of at least 256 vectors. Preferably, a program running on work station 104 (FIG. 1) ensures that each module is at least 256 vectors long.

The location of each module in pattern memory 116 is not critical to the invention. Conveniently, a program running on work station 104 (FIG. 1) may locate the modules in memory. The specific memory used to implement pattern memory 116 may generate restrictions on the placement of modules in pattern memory 116. For the circuit described in greater detail below, the memory devices used to implement pattern memory 116 output data in blocks of 64 vectors and each block must always start on an address that is a multiple of 64. Accordingly, some simplifications can be obtained if each module starts at a location which has a memory address that is a multiple of 64.

Module location table (MLT) 204 stores a description of the location of each module in pattern memory 116. As shown in FIG. 2, that description may be the start address and the length of the module. Other descriptions could be possible, such as the ending address and the length or the start address and the ending address. Each location in MLT 204 establishes a pointer to one module in patter memory 116.

The execution order of the modules is controlled by information in vector module table (VMT) 206. The successive locations in VMT 206 list modules to be executed in the order in which they are to be executed. The information in VMT 206 indicates which module to execute by addressing the location in the MLT which gives the location of that module. This information is used by the tester to access the designated module. When the module designated by the first location in VMT 206 has been executed, the module designated by the next location in VMT 206 is accessed and executed. VMT address control 208 keeps track of which is the next location in VMT 206 to execute.

VMT address control circuit could be as simple as a counter which increments as each module is executed and stops when the final module is reached. It could, however, contain control logic which allowed it to repeatedly loop through a group of locations in VMT 206.

MLT and VMT are also loaded with information provided by work station 104. Preferably, software tools on work station 104 keep track of the locations in pattern memory 116 where modules have been stored and can generate the contents of MLT 204 automatically. The order in which the modules are executed is dictated by the user who prepares the test pattern. Preferably, those software tools also generate the information for VMT 206 once a user has specified the order in which the modules are to be executed.

Numerous advantages flow from the memory architecture shown in FIG. 2. One advantage is that it is possible to reuse modules in a pattern without repeating them in pattern memory 116. All that is required is one entry in VMT 206 for each time the module is to be executed. This advantage allows the pattern memory 116 to be smaller or, alternatively, allows tester 100 to execute bigger patterns with the same amount of memory. In this way, it is possible to implement a function much like calling a subroutine without the need for a separate subroutine memory or control circuitry normally associated with subroutine calls and returns, all of which is generally expensive to implement.

The architecture also makes it possible to change the order of execution of modules without reloading the contents of pattern memory 116. Changing the contents of VMT 206 changes the execution order of modules in pattern memory 116. While pattern memory 116 is too large to practically reload during a test of one device under test, VMT 206 is much smaller and can be loaded quickly enough that it would not significantly slow down a testing operation. Such an ability would be particularly useful where it is desired to test a device by executing more than one pattern. All the modules needed for both patterns could be loaded into pattern memory 116 and then VMT could be loaded with information on the execution order for the first pattern and then reloaded with the execution order for the second pattern.

The benefits mentioned above primarily occur while a part is being tested. The architecture of FIG. 2 also provides benefits when a test engineer is developing a program. While developing a pattern, a test engineer will execute the pattern, observe bugs in the pattern, change one or more modules, reload the pattern and then repeat the process. Not having multiple copies of the same module in the pattern eliminates the need to make the same change multiple times. Also, it is much easier to add vectors to a module than has previously been possible. Because the execution order of modules is dictated by the contents of VMT 206 rather than their location in pattern memory 116, when vectors need to be added to a module, that module can be moved to a larger block of memory without disturbing any other modules. Also, specific modules can be isolated for execution just by changing the contents of VMT 206. All of these functions can be performed without reloading the pattern into pattern memory 116. The process of debugging a pattern can therefore be greatly speeded up.

Figure 3:
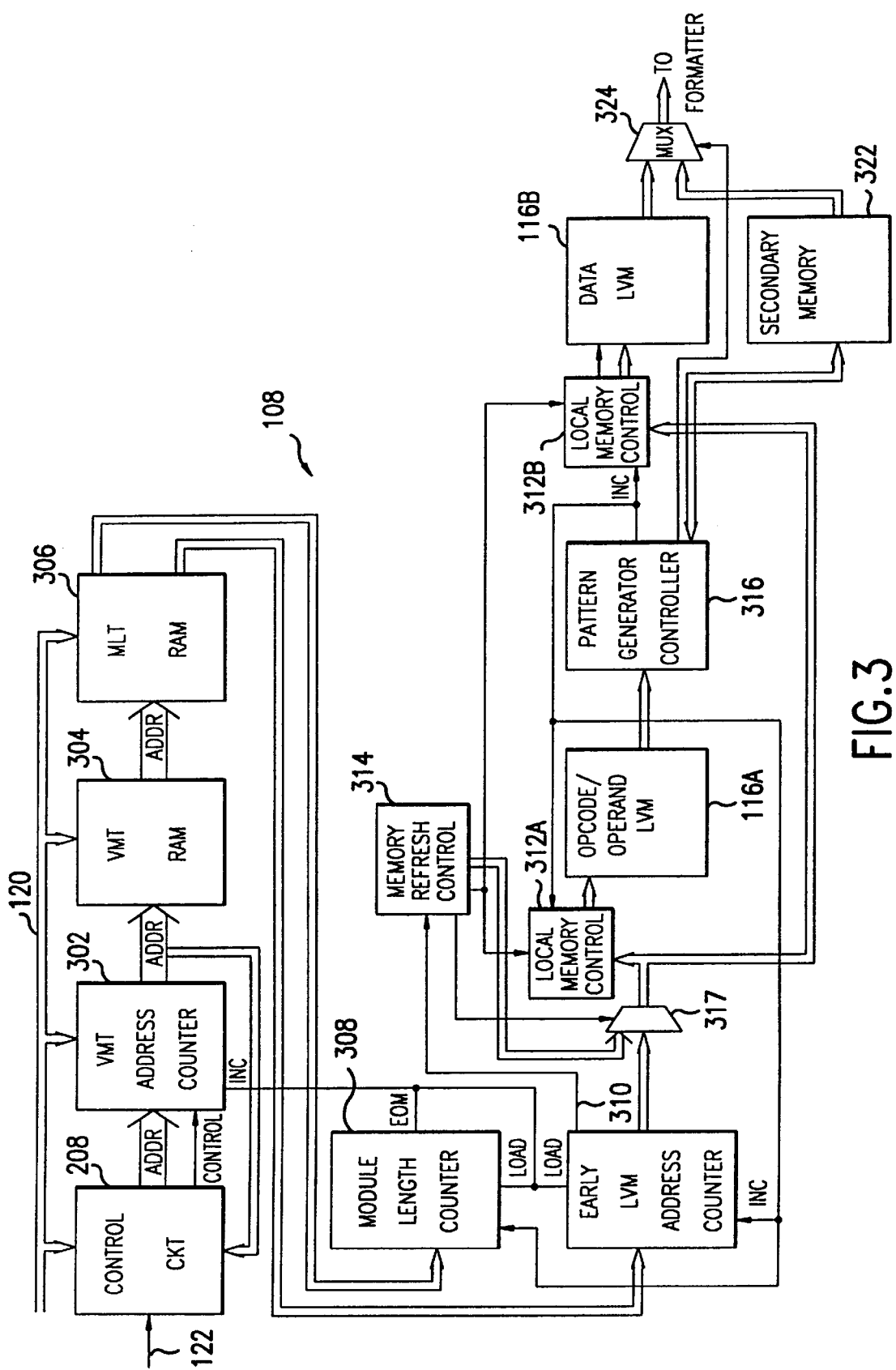
FIG. 3 is a block diagram showing in more detail the pattern generator of the tester of FIG. 1.

Turning now to FIG. 3, pattern generator 108 (FIG. 1) is shown in greater detail. FIG. 3 shows that VMT 206 (FIG. 2) is implemented as a separate VMT RAM 304. Here an 80 nsec RAM with 256K locations is used. VMT RAM 304 is connected to system bus 120 for loading of information. The data output lines of VMT RAM 304 are connected to the address lines of MLT RAM 306.

MLT 204 (FIG. 2) is also implemented as a separate MLT RAM 306. Here an 80 nsec RAM of size 64K locations is used. The data output lines of MLT RAM 306 are split into two groups. One group, carrying the data indicated as the start address of the modules in FIG. 2, provides the input to early LVM address counter 310. The second group, carrying the data which specifies the length of each module in FIG. 2, provides the input to module length counter.

Here, pattern memory 116 is split into pattern control memory 116A and pattern data memory 116B. The two pieces of pattern memory 116 are addressed separately to facilitate pipelining. Pipelining is a known technique in high speed digital computer systems. It requires pipeline registers which synchronize data at various places in an overall system and also synchronized clock signals to control the operation of various pieces of the system. Circuitry used to make the system operate in a pipelined fashion is not explicitly shown as it is known in the art and not critical to the operation of the invention.

Early LVM address counter 310 is an address counter as conventionally used in a tester system. As will be described in detail below, data is read from memory in blocks of 64. Counter 310 produces an output, denoted NEW 64, connected to memory refresh control circuit 314. When this signal is asserted, it indicates that counter 310 has advanced to an address which requires a new block of 64 bits to be read from memory. This signal is asserted when the counter crosses a x64 boundary (i.e. increments to an address which is a multiple of 64 such as incrementing from 63 to 64 or incrementing from 127 to 128, etc.). The NEW 64 signal is also asserted when a new address indicating the start of another module is loaded into counter 310.

Also as described below, memory 116 is accessed in banks. The banks are called the even and the odd bank. Blocks of data with addresses that start at an even multiple of 64 are in the even bank (i.e. blocks that start at addresses 0, 128, 256, etc.). Blocks of data with addresses that start at an odd multiple of 64 are in the odd bank(.e. blocks that start at 64, 192, 320, etc.). Counter 310 also produces a signal which runs to memory refresh control 314 indicating whether its current address is in the even or odd memory bank. Preferably, counter 310 is implemented as part of a semi-custom ASIC and the signals which run to memory refresh control circuit 314 are easily derived from the value in the counter.

Pattern control memory 116A has associated with it a local memory control circuit 312A. As will be described in greater detail in conjunction with FIG. 4, pattern data memory 116 is implemented with memory chips which output values in bursts of 8, 8 bit words (64 bits per burst). Local memory control 312A converts these 64 values into 64 sequential values. Also as described below, pattern memory 116 is implemented with DRAM chips which must be periodically refreshed.

The output of pattern control memory 116A is provided to pattern generator controller 316. Pattern generator controller 316 is a controller of the type typically used in testers. It determines, based on the information in pattern control memory 116A, the next address for pattern data memory 116B. To run at high speeds, the next address is preferably limited to be either the next address in vector memory 116, the same as the current address in vector memory 116 or an address in secondary memory 322, which is described below. Pattern generator controller 316 outputs an INC signal when the next address is to be just one more than the current address. When execution is not to proceed to the next vector in sequence, the INC signal is not asserted. As can be seen in FIG. 3, the INC signal is connected to the counters which advance the address.

It will be appreciated that in transitioning from the execution of one module in LVM 116 to the next, the addresses in memory from which vectors are executed will not necessarily be consecutive. However, tester 100 can still operate at high speed because the first address in the next module may be computed in advance from the information stored in MLT RAM 306. Such an arrangement provides an advantage over program control constructs, such as a jump statement, in which the next address can not be computed until the current instruction is fetched and decoded.

Pattern data memory 116B is similar to pattern control memory 116A. It has a local memory control circuit 312B associated with it which also receives control inputs from memory refresh control 314. The length and access speed of pattern data memory 116B and pattern control memory 116A are preferably identical. However, pattern data memory 116B may contain more bits per each address. Pattern data memory 116B contains as many bits per address as are necessary to specify the data provided to formatter 110 (FIG. 1).

Pattern generator 108 optionally includes a secondary memory 322. Secondary memory 322 may be a subroutine memory as known in the art. In that instance, pattern control memory could also contain control instructions which specify that the next vector to be executed is to be executed from a location in the secondary memory. When such an instruction is encountered, pattern generator controller 316 changes the state of the INC lines to halt the counters which advance addresses for pattern data memory 116B. As is conventional, switching execution to secondary memory 322 involves generating successive addresses for the secondary memory. The address generating circuitry for secondary memory 322 is not explicitly shown.

Upon completion of the execution of vectors from secondary memory 322, which is usually signaled by the execution of a RETURN opcode from secondary memory 322, the INC signal is again asserted so that sequential execution of vectors resumes from pattern data memory 116. Mux 324 controls whether pattern data from pattern memory 116B or from secondary memory 322 reaches formatter 110 (FIG. 1). Mux 324 is switched by a control line from pattern generator controller 316.

In operation, VMT address counter 302 is loaded with a starting value from control circuit 208. Control circuit 208 is connected to work station 104 (FIG. 1) over system bus 120 and receives information from work station 104 specifying the starting and stopping locations in VMT RAM 304. These values are stored in registers in control circuit 208. At the start of a pattern, the starting address is loaded into VMT address counter 302. As VMT address counter 302 counts, control circuit 208 compares the value in counter 302 with the ending address it has stored. When the ending address is reached, counter 302 is not further incremented and the end of the pattern is indicated to the work station 104.

Control circuit 208 may optionally contain other registers which indicate whether a loop should be repeated over a set range of addresses. In such an instance, control circuit 208 would preferably contain registers to indicate the beginning address in VMT RAM 304 of the loop and the ending address in VMT RAM of the loop. Following execution of the ending address of the loop, the beginning address of the loop would be loaded into VMT address counter 302. This loop could be repeated infinitely. Alternatively, control circuit 208 could also contain a counter which counted the number of times the top address was loaded into VMT address counter 302 and disabled looping when the value in the counter was reached.

As each location in VMT RAM 304 is addressed, the contents of the addressed location are provided to MLT RAM 306 as an address. This address accesses the location in MLT RAM 306 which stores the start address of a module in pattern memory 116 and its length. The start address is loaded into early LVM address counter 310 and the length is loaded into module length counter 308.

Module length counter 308 and early LVM address counter are clocked together such that each time early LVM address counter 310 advances the address in pattern memory 116 by one vector, module length counter 308 counts. When the address in early LVM address counter has advanced to the end of a module, module length counter will have counted down to zero and outputs an end of module EOM signal.

The EOM signal advances the address in VMT address counter 302, which triggers the provision of the start address of the next module to early LVM address counter 310 and the length of the next module to module length counter 308. The modules in pattern memory 116 are thus executed in the order specified in VMT RAM 304 without regard to their location in pattern memory 116.

It should be noted that the memory architecture of FIG. 3 is well suited for use in conjunction with standard pipeline design techniques. Once an EOM signal is received, the location of the next module to be executed could be computed from VMT RAM 304 and MLT RAM 306. In this way, when the next EOM signal is received, the start address of the next module would already be available and execution of that module could begin immediately. Pipelined designs are well known and the hardware and control circuitry needed to implement a pipelined design are not explicitly shown.

Pattern memory 116 is preferably a DRAM because of the low cost and wide availability of large DRAMs. DRAM must be refreshed periodically and in operation read and refresh cycles are usually interleaved. Memory refresh control 314 provides control information which allows pattern control memory and pattern data memory to be refreshed sufficiently often such that no data is lost. However, it is not necessary that a refresh be performed after every read operation. As will be described below, in order to make the tester operate very quickly, the times at which refresh operations are performed are dynamically altered based on whether there is data which needs to be read. When control switches from one module to another such that vectors are executed nonsequential address in pattern memory 116, there is a greater demand for data to be read from pattern memory 116. By dynamically altering the refresh times, data is temporarily read from the memories at a faster rate.

Figure 4:
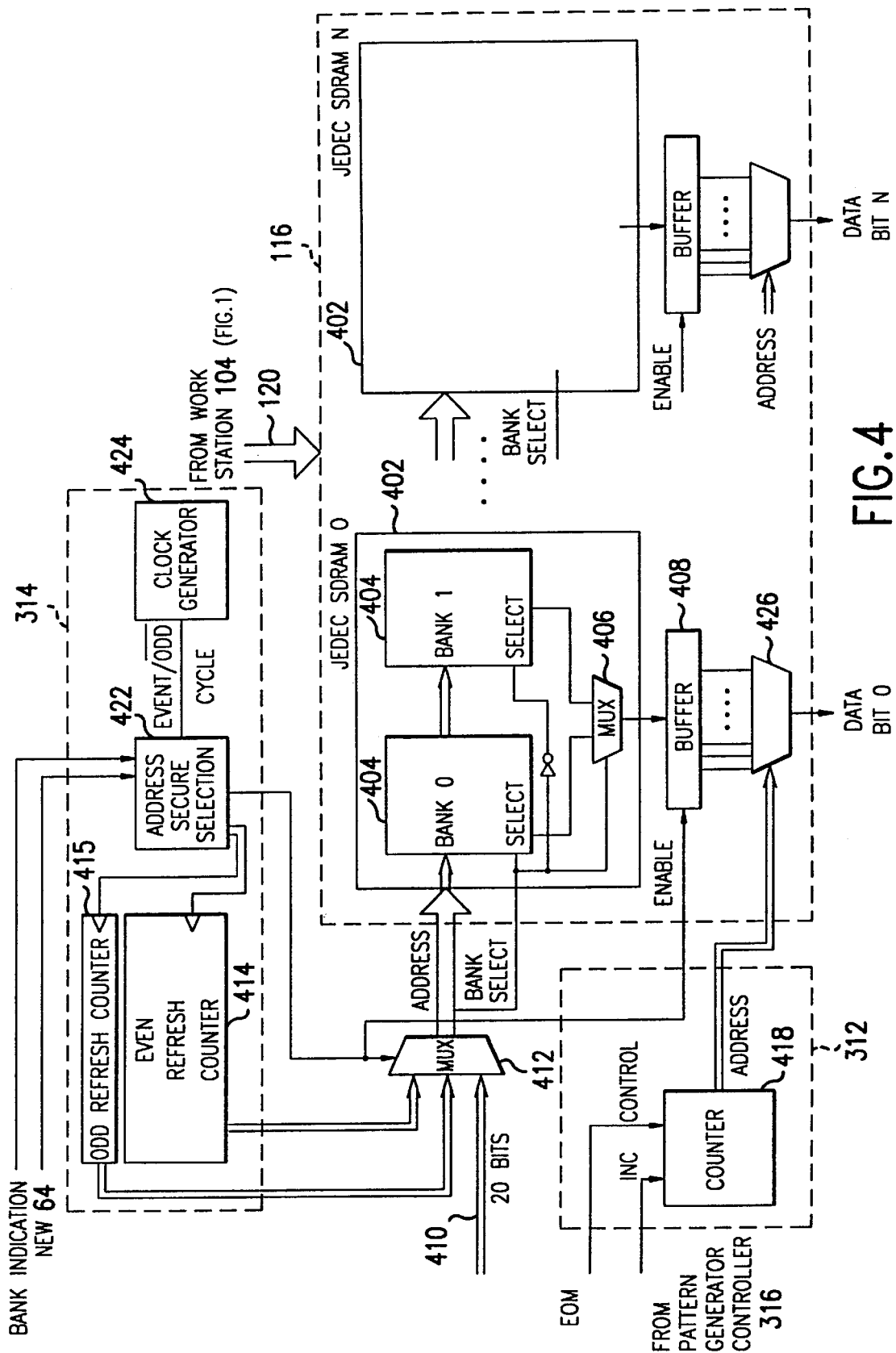
FIG. 4 is a block diagram showing in more detail the memory and memory control circuits of the pattern generator of FIG. 3.

Turning now to FIG. 4, the control circuitry for pattern memory 116 is shown in greater detail. The circuit shown in FIG. 4 may be taken to represent either pattern data memory 116B or pattern control memory 116A.

Pattern memory 116 is made up of a plurality of memory chips 402, with one chip for each bit in the vector stored in pattern memory 116. These memories are termed JEDEC SDRAM, which implies that the memories meet specifications established by JEDEC. The term SDRAM indicates that the memories are synchronous dynamic RAMS. Synchronous memories produce outputs at times synchronized to a clock (not shown).

To implement a 200 MHz tester, 66 MHz memories clocked at 50 Mhz are preferably used. JEDEC SDRAMs are organized into blocks. Each block contains eight bytes of eight bits each. Thus, one block has 64 bits. The memories are designed to operate in "burst mode." During one burst, one block is output from the memory at the memory output rate. Here, the memory runs at 50 MHz so one byte is output every 20 nsec and 8 bytes are output in 160 nsec. In burst mode, then, the memories are outputting data at an effective rate of 400 MHz. This rate is twice as fast as tester 100 is using the data if it operates at 200 MHz. Two things happen to prevent the data from being lost because it is being output faster than it can be used. First, in normal operation, every other memory cycle is used to refresh the memory, effectively cutting the data rate in half. Second, the output of the memory is buffered.

The output of each memory chip 402 is provided to a buffer 408. Buffer 408 holds several blocks of data. As each block of data is read from memory chip 402, it is stored in buffer 408. In a preferred embodiment, buffer 408 holds four blocks of data, or a total of 256 bits. These values represent 256 consecutive values of one bit in pattern memory 116. As shown in FIG. 4, there is one memory chip for each data bit stored in pattern memory 116.

Buffer 408 is addressed by a counter 418. Since buffer 408 contains 256 locations, counter 418 has eight bits. As counter 418 counts, it sequentially addresses the locations in buffer 408. Counter 418 increments as long as the INC line is enabled. As described above, this line is enabled as long as vectors are to be read sequentially from pattern memory 116.

The information which specifies which block of 64 bits is read out of memory 116 is provided on address bus 410. As blocks of 64 bits are read, there is no need for the six least significant address bits to be provided to memory 116. For a system which can access 64M vectors, there will be twenty address lines, but the exact number is not critical to the invention. These address lines are derived from early LVM address counter 310 (FIG. 3). Each successive block read from memory is stored in successive locations in buffer 408. Buffer 408 "wraps around" such that after one block is written at the bottom of the buffer, the next block is written at the top of the buffer. Circuitry to control this write operation is not explicitly shown as it is well known.

Counter 418 has a control input which is connected to the end of module EOM signal described in conjunction with FIG. 3. Thus, at the end of a module, or more importantly by the beginning of the next module, counter 418 is set to access the beginning of the next block of data stored in buffer 408. In the preferred embodiment, counter 418 accesses the next block by setting its six least significant bits to zero and incrementing its higher order bits. For this reason, every module must start at addresses having six least significant bits of zero (i.e. each module must be loaded into memory at an address that is a multiple of 64). It should be appreciated, though, that the number 64 is derived from the number of bits which memory chip 402 outputs in one burst. The starting address of each module is preferably a multiple of the number of bits "bursted" by the memory chips.

Memory chips 402 are preferably dynamic RAMs, which means that they must be refreshed. Refresh circuitry is built into JEDEC DRAM chips. In the preferred embodiment, though, that circuitry is not used. Having separate refresh circuitry allows the memories to execute patterns faster.

Memory refresh control circuit 314 includes two refresh row counters, an even refresh counter 414 and an odd refresh counter. Two counters are used because JEDEC SDRAM chips have two banks, called "bank 0" and "bank 1" or "even bank" and the "odd bank." The even row counter 414 indicates the next address to be refreshed in the even bank. Likewise, odd refresh counter 415 indicates the next address to be refreshed in the odd bank. Because memory is refreshed in blocks of 64 bits, refresh counters 414 and 415 count by 64 (i.e. they do not provide the six least significant bits of the address to memory 116).

The addresses in refresh counters 414 and 415 are provided to inputs of mux 412. Address bus 410 is also provided at an input to mux 412. Thus, mux 412 selects the address of data to be read from the memory and stored in buffer 408, the address to be refreshed in the even bank, or the address to be refreshed in the odd bank. As a refresh operation is performed whenever data is read from the memory, all of these addresses specify read addresses. However, for a refresh operation, the data which is read from memory is not stored anywhere. Memory address selection circuit 422 controls mux 412 as well as buffer 408. When address source select circuit 422 selects the address of address bus 410, it also enables buffer 408 so that the data which is read is stored. However, when the selected address is a refresh address, buffer 408 is disabled and does not store data.

JEDEC memory chips 402 contain two banks of memory 404 for added speed of operation. Memory chip 402 can only "burst" a row of data if the row address of the data was established before the start of the burst. To keep the memory chips 402 operating at the fast burst rate, reads from memory chips 402 alternate between banks 404. While one of the banks 404 is bursting data, the next row address is being established on the other of the banks 404.

JEDEC memory chips 402 contain internal circuitry which allows this switching between banks. That circuitry is illustrated in FIG. 4 as mux 406 and select inputs on the banks 404 which are fed by complimentary logic signals derived from the row address.

In operation, some mechanism is needed to track whether the next operation is to access the even bank or the odd bank. Clock generator 424 provides a clock which defines an even memory cycle and an odd memory cycle. For the example used herein, each cycle is 160 nsec long. The output of clock generator 424 is provided to address selection circuit 422. During the even cycle, memory 116 accesses the even bank and during the odd cycle memory 116 accesses the odd bank. It should be appreciated that the memory addresses themselves indicate whether the data is in the even or odd bank such that once the address is selected, it is not necessary to route the output of clock generator to other portions of the memory.

Address selection circuit 422 operates to select an address to access the appropriate bank during each even and odd cycle. Address selection circuit is preferably implemented as a portion of a semi-custom ASIC which has been programmed to perform the following functions: When a NEW 64 signal has been received from early LVM address counter 310 and the bank indication signal from counter 310 indicates that the address from counter 310 is to be fetched from the bank in memory which is appropriate for the current memory cycle, the address on bus 410 is selected at mux 412 and buffer 408 is enabled to store data. However, when there is no NEW 64 signal from counter 310 or the address from counter 310 is in a bank which is not appropriate for the current memory cycle, a refresh cycle is performed. During an even memory cycle, the address from even refresh counter 414 is passed through mux 412. During an odd cycle, the address from odd refresh counter 415 is passed through mux 412. Whichever counter is selected, address select circuit 422 then sends a signal to that counter to increment it. Also, whenever a refresh address is provided, the input of buffer 408 is disabled so no data is stored.

Consider that in normal operation memory access starts at an even cycle with a read from the even memory bank. As counter 310 is intended to increase by 64 every 320 nsec (200 Mhz data rate) but a memory cycle is 160 nsec long, in the next odd memory cycle, counter 310 will not have generated a new address. Accordingly, an odd refresh will occur. In the following even memory cycle, counter 310 will require a read from the odd bank and so the even bank will be refreshed. The next cycle will be an odd cycle and counter 310 will require a read from the odd bank, which will occur. For so long as sequential addresses are called for from counter 310, this cycle will repeat: read from the even bank, refresh the odd bank, refresh the even bank, read from the odd bank.

This cycle is, however, interrupted when the start address of a module is loaded in the early LVM address counter 310. In order to ensure that adequate refreshing occurs, each module must be long enough such that at least one even bank refresh and one odd back refresh occurs. Since a module can end after executing only one vector in a 64 vector block, we must allow enough time to do two refreshes and to fetch one block which provides only one useful vector. This means we must fetch at least three other 64 vector blocks. Accordingly, there must be at least 192 vectors in each module. Any number greater than 192 may be chosen. In the preferred embodiment, 256 was chosen.

The same conclusion would result regardless of whether the modules start in even or odd banks. Each module must contain at least 193 vectors to ensure that both banks of the memory are adequately refreshed.

Circuitry to generate a memory cycle clock is not explicitly shown. It is, however, well known in the art that digital circuits employ timing circuits and conventional design techniques are employed here to implement the required timing circuits. Circuitry for loading data into pattern memory 116 is also not explicitly shown. Memory chips 402 are, however, connected to system bus 120 and data is loaded into the memories over the bus.

Having described a preferred embodiment of the invention, various alternative embodiments could be constructed. It was described that the VMT and MLT are implemented as separate data structures in separate memories. The information from both of these could be combined into one memory or into one data structure. The combined structure could, for example, be one list of modules which included the location of each module in pattern memory.

Figure 5:
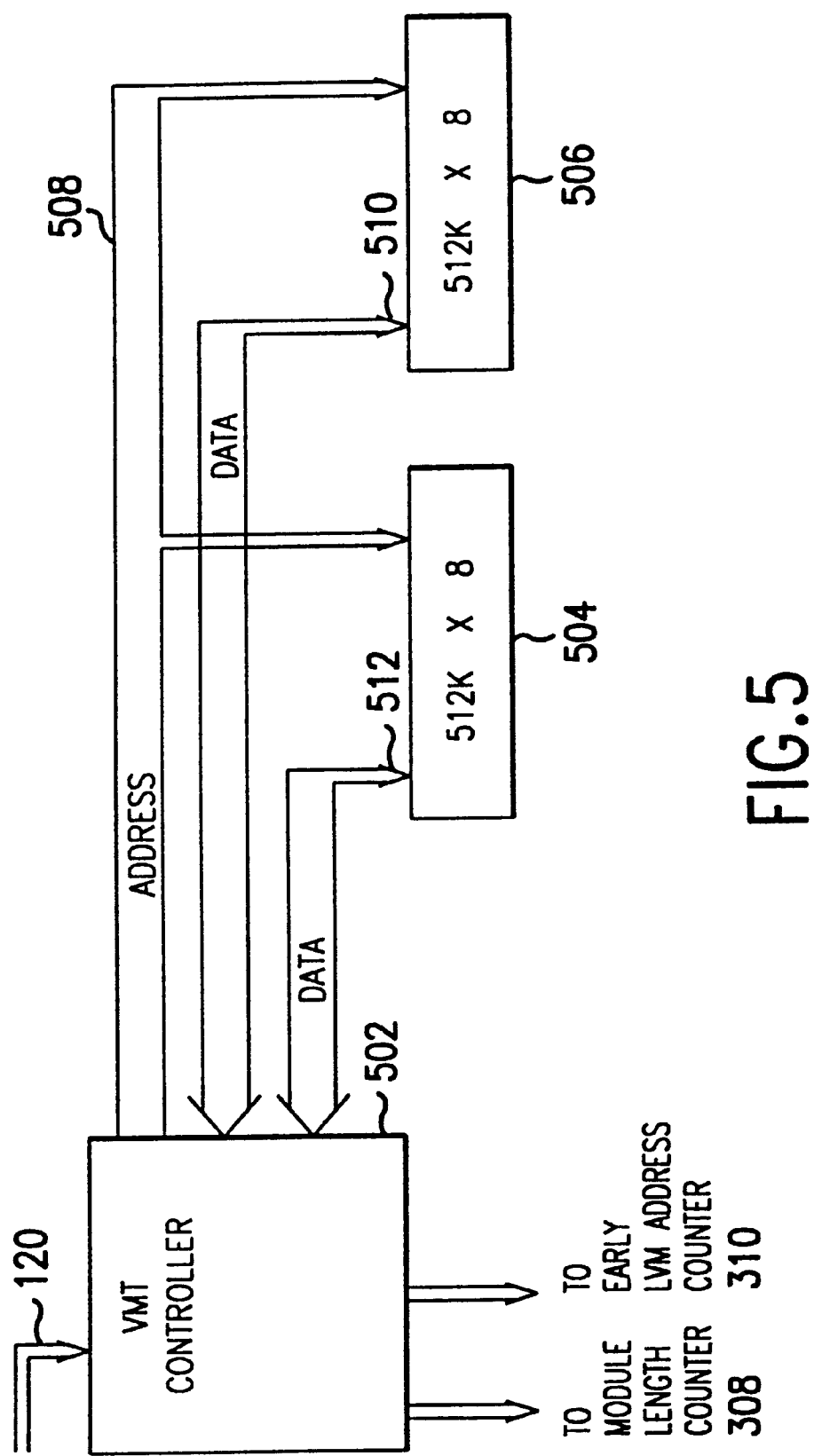
FIG. 5. is a block diagram of an alternative implementation of the vector module table of the invention.

FIG. 5 shows an alternative implementation of VMT 206 and MLT 204. In FIG. 5, two 512K×8 bit memories 504 and 506 are used to store both the information in VMT and MLT. The address lines of memories 504 and 506 are tied together such that the memories are addressed together. They have separate output data lines so that they effectively output 16 bits of data. The upper addresses in the memory are used to store the information in the VMT. Some arbitrary address in memories 504 and 506 is defined to be the start of the MLT. The addresses stored in the VMT portion of memory represent an offset from this starting address. To get an address from the VMT, VMT controller 502 reads one location from memories 504 and 506. VMT controller 502 then adds the start address of the MLT to this address and reads the contents of memories 504 and 506 at that address. Because the information in MLT is 52 bits long in the preferred embodiment, three more read operations are then performed from successive addresses in memories 504 and 506. All of the information read is then provided by VMT controller 502 to counters 308 and 310. VMT controller 502 could be implemented as a semi-custom ASIC as is conventionally used in the art. It would include the counters, registers and control logic discussed above.

As another example, it was described that the VMT RAM included a single list of modules making up one pattern. It would be possible to store multiple lists of modules in VMT RAM so that multiple patterns could be executed without reloading any memories. In that instance, control circuit 208 would load VMT address counter with the address of the pattern to execute. Another way to implement multiple patterns would be to have VMT address counter 302 count either up or down. The list of modules for one pattern could be stored at the top of VMT RAM 304 and a second pattern could be stored at the bottom of VMT RAM going up. By counting up from zero, the first pattern would be executed. By counting down from zero minus one (one's compliment), the second pattern would be executed. Where memory addresses are stored in this fashion, the up counter can be easily turned into a down counter by simply inverting the individual output bits.

A further modification would be to incorporate memory offsets into the memory architecture. To start a module at other than its first vector, the offset would be added to the start location value stored in MLT RAM 306 before loading into early LVM address counter 310. The same offset would be subtracted from the module length before loading into module length counter 308.

Another variation would be to include in control circuitry 208 hardware to cycle through the list of modules in VMT 206 a number of times. The number of times could be a programmed value provided over system bus 120. In this way, the number of times a pattern is repeated can be programmed by a user. Alternatively, VMT 206 might be augmented to include a repeat count for each module. In this way, the number of times a module is repeated can be programmed.

As an example of a further variation, it was described that the order of execution of modules was provided from a VMT RAM. As a new module to execute is selected at a much slower rate than the next vector to execute, information about the next module to execute might be provided over system bus 120 rather than being read from a RAM in the tester.

It should also be understood that the memory architecture described herein can be used in conjunction with known techniques for making a fast or flexible tester. Secondary memory 322 could be a small SRAM as conventionally used in testers for a subroutine memory. In addition, techniques such as are described in U.S. Pat. No. 5,270,582 for High Speed Timing Generator to Brown et al. (which is hereby incorporated by reference) could be used in conjunction with this technique to make the tester run faster.

Also, many features of the preferred embodiment are not essential to the invention. For example, opcode LVM 116A is shown as a separate data structure from data LVM 116B. Such a difference is not critical to the invention. Both data and control information could be stored in a single memory or distributed over multiple memories.

It is felt, therefore, that the invention should be limited only by the spirit and scope of the appended claims.

What is claimed is:

1. Tester system apparatus comprising:
 a) first memory means for storing a test pattern, the pattern including a data portion and a control portion, said first memory means having a plurality of address lines;
 b) a second memory having a data output and a plurality of address lines;
 c) an address counter connected to receive data from the data output of the second memory and an output coupled to the address lines of the first memory means;
 d) a second counter having an output and an input connected to receive data from the data output of the second memory; and
 e) control means for accessing at least one location in the second memory and loading the address counter and the second counter with data stored in the at least one location in the second memory in response to the second counter reaching a predetermined value.

2. The tester system of claim 1 additionally comprising means for providing address information to the control means at successive intervals, said address information representing the location in the second memory accessed by the control means.

3. The tester system of claim 2 wherein the means for providing address information at successive intervals comprises an ordered list of address information stored in a memory which is accessed sequentially by the control means.

4. The tester system of claim 3 wherein the control means additionally comprises memory means for storing a beginning of loop indication, indicating the entry in the ordered list which represents the beginning of a loop, and an end of loop indication, indicating the entry in the ordered list which represents the end of the loop, and the control means additionally comprises means for sequentially accessing the ordered list of address information until it reaches the end of loop and thereafter sequentially accessing the entries in the ordered list from the beginning of loop indication.

5. The tester system of claim 2 wherein the means for providing address information at successive intervals provides address information in response to the second counter reaching a predetermined value.

6. A tester system apparatus as in claim 1, wherein:
 a) the first memory comprises a dynamic memory adapted to store a plurality of instructions, said memory comprising a first bank and a second bank and being adapted to output a block of data in response to a read command;
 b) said address counter having status outputs indicating that the address output has taken on a value indicating the start of a block of data in the memory and whether the block is in the first or second bank of the memory;

c) the tester system additionally comprising:
  i) a first refresh address counter having an address output;
  ii) a second refresh address counter having an address output;
  iii) means for generating a memory cycle signal alternating between a first state indicating that the first bank of the memory is to be accessed and a second state indicating that the second bank of the memory is to be accessed; and
  iv) address selection means, responsive to the address outputs of the address counter, the first refresh address counter and the second refresh address counter, the means for generating a memory cycle signal and the status outputs of the address counter, for applying a selected address to the memory at each memory cycle, wherein the selected address is:
    A) the address output of the address counter when the status outputs of the address counter indicate that the address counter has taken on a value indicating the start of a block and the block of data is in the bank which the memory cycle signal indicates is to be accessed;
    B) the address output of the first refresh counter when the memory cycle signal indicates that the first bank is to be accessed and the status outputs of the address counter do not indicate that the address counter has taken on a value indicating the start of a block and the block of data is in the bank which the memory cycle signal indicates is to be accessed; and
    C) the address output of the second refresh counter when the memory cycle signal indicates that the second bank is to be accessed and the status outputs of the address counter do not indicate that the address counter has taken on a value indicating the start of a block and the block of data is in the bank which the memory cycle signal indicates is to be accessed.

7. The device of claim 6 additionally comprising a buffer adapted to receive at least one block of data coupled to the memory, said buffer having an enable input coupled to the address selection means and wherein the address selection means additionally comprises means for enabling the buffer when the address output of the address counter is the selected address and disabling the output buffer when the address output of the first or second refresh counters is the selected address.

8. The device of claim 7 wherein the device is a tester having modules of vectors loaded into the memory and additionally comprising means for selecting the nonsequential execution order of the modules, said means for selecting including a means for loading the address counter with the start address of a module of vectors and wherein the status output of the address counter indicates the start of a block of data when the start address of a module is loaded in the address counter.

9. The device of claim 8 wherein the dynamic memory comprises in excess of 1 Gigabyte of dynamic memory.

10. The device of claim 9 wherein the dynamic memory comprises a plurality of JEDEC SDRAM chips.

11. The device of claim 10 wherein each memory chip is clocked to provide a maximum burst data rate and the tester executes vectors at a predetermined maximum rate equal to one half of said maximum burst rate.

12. The device of claim 11 wherein each memory chip is clocked to output one byte of data at least at the rate of 50 MHz.

13. A method of operating a tester comprising the steps of:
a) loading a plurality of pattern modules into sequential access memory, each pattern module including a data and control portion;
b) storing an ordered list of pattern modules to be executed and the location in memory of each pattern module; and
c) generating addresses to the memory by:
  i) using the stored location of the first pattern module in the ordered list to generate an initial address;
  ii) advancing the address until the end of the first pattern module is reached;
  iii) repeating steps i) and ii) for successive pattern modules in the ordered list.

14. The method of claim 13 wherein the step of storing an ordered list and location of pattern modules comprises separately storing an ordered list of modules and the location of each module in memory.

15. The method of claim 14 wherein the step of storing an ordered list of pattern modules comprises storing an ordered list of pattern modules wherein at least one pattern module appears at multiple locations in the ordered list.

16. The method of claim 14 wherein the step of storing the location of each module comprises storing in a second memory a single record for each module including the start address and length of the module and the step of storing an ordered list comprises storing the address in the second module of a record.

17. The method of claim 16 additionally comprising the steps of, after the step of generating addresses to the memory, storing a different ordered list of modules.

18. The method of claim 17 wherein the step of storing a different ordered list of modules comprises storing a different ordered list without changing a portion of the plurality of modules stored in memory.

19. The method of claim 13 wherein the step of generating addresses to memory includes:
a) detecting when a predetermined pattern module in the ordered list has been executed;
b) repeating execution of pattern modules in the ordered list starting at a second predetermined location in the ordered list.

20. The method of claim 19 wherein the step of repeating execution of pattern modules comprises repeating execution of the predetermined pattern module a predetermined number of times.

21. A method of operating a tester comprising the steps of:
a) loading a plurality of pattern modules into nonsequential locations in a dynamic RAM memory, each pattern module comprising a plurality of vectors stored in sequential order in the memory;
b) retrieving vectors from one of the modules in sequential order and executing the retrieved vectors at an execution rate;
c) refreshing the dynamic RAM memory at a first refresh rate while retrieving vectors in sequential order;
d) retrieving vectors from a second pattern module and executing the retrieved vectors at the execution rate such that vectors are executed continuously at the execution rate during a transition from the first to the second module; and
e) refreshing the dynamic RAM at a second refresh rate, slower than the first refresh rate while initially retrieving vectors from the second pattern module; and
f) refreshing the dynamic RAM at the first refresh rate after refreshing the dynamic RAM at the second refresh rate.

* * * * *